United States Patent [19]

Furuhata

[11] Patent Number: 5,250,447
[45] Date of Patent: Oct. 5, 1993

[54] SEMICONDUCTOR DEVICE AND METHOD OF MANUFACTURING THE SAME

[75] Inventor: Tomoyuki Furuhata, Suwa, Japan

[73] Assignee: Seiko Epson Corporation, Tokyo, Japan

[21] Appl. No.: 744,853

[22] Filed: Aug. 14, 1991

[30] Foreign Application Priority Data

| Aug. 23, 1990 [JP] | Japan | 2-221932 |
| Aug. 23, 1990 [JP] | Japan | 2-221933 |
| Jul. 16, 1991 [JP] | Japan | 3-175391 |

[51] Int. Cl.⁵ .................. H01L 21/265; H01L 27/02
[52] U.S. Cl. ........................... 437/28; 437/31; 437/41; 437/106; 437/243; 257/378; 257/754
[58] Field of Search ............ 357/43; 437/15, 28, 437/38, 41, 106, 243; 257/378, 754

[56] References Cited

U.S. PATENT DOCUMENTS

| 5,065,208 | 11/1991 | Shah et al. | 357/43 |
| 5,075,752 | 12/1991 | Maeda et al. | 357/43 |
| 5,128,740 | 7/1992 | Uchida et al. | 357/43 |

Primary Examiner—Edward Wojciechowicz
Attorney, Agent, or Firm—Spensley Horn Jubas & Lubitz

[57] ABSTRACT

A semiconductor device in which both a bipolar element and a MOS element are formed on a single semiconductor substrate. This device is composed of a semiconductor substrate, a bipolar element formed on the substrate so as to insulate a base region and an emitter electrode from one another by a base/emitter electrode insulating film, and a MOS element formed on the substrate in such a manner that a gate electrode together with an emitter electrode of the bipolar element are formed in a common layer and that a gate oxide film is formed between the gate electrode and another layer adjacent to and under the first-named layer. The base/emitter electrode insulating film has a thickness greater than that of the gate oxide film.

11 Claims, 6 Drawing Sheets

SEMICONDUCTOR DEVICE AND METHOD OF MANUFACTURING THE SAME

BACKGROUND OF THE INVENTION

1. Field of the Invention:

This invention relates to a semiconductor device and a method of manufacturing the semiconductor device, and more particularly to a semiconductor device in which both transistor elements and MOS elements are mounted on a single semiconductor substrate and to a method of manufacturing such a semiconductor device.

2. Description of the Related Art:

There is currently known a semiconductor device in which both bipolar transistor elements and MOS elements are mounted on a single semiconductor substrate. In such semiconductor device, as disclosed in an article entitled "A Subnanosecond Bi-CMOS Gate-Array Family", IEEE 1986 CUSTOM INTEGRATED CIRCUITS CONFERENCE, pp. 63–66, an emitter electrode of the transistor element and a gate electrode of the MOS element are formed in a common layer, which is usually a polycrystalline silicon layer.

A prior art semiconductor device of this type is shown in FIG. 6 of the accompanying drawings. To fabricate this device, an n+-type buried layer 12 and a p+-type buried layer 14 are formed on a p-type silicon substrate 10. An n-type epitaxial silicon layer 16 is grown on layers 12 and 14 and a p-type well 18, a p+-type channel stopper 20 and a field oxide film 21 are formed in n-type epaxial grown silicon layer 16.

Then, on the surface of the resulting semiconductor substrate, a gate oxide film 22 is formed by thermal oxidation, and at a bipolar-transistor forming region 100, a p-type base region 24 is selectively formed by ion implantation, after which an emitter opening 23 is formed in gate oxide film 22 and over the entire surface shown in FIG. 6, including emitter opening 23 and gate oxide film 22, a polycrystalline silicon layer is formed for producing an emitter electrode 26 and a gate electrode 28.

Subsequently, after adding an n-type impurity such as phosphorous or arsenic to the entire surface of the substrate, i.e. to the polycrystalline silicon layer, by ion implantation, the semiconductor stacked substrate is annealed at a predetermined temperature in a predetermined atmosphere to form an n+ emitter region 30, whereupon the polycrystalline silicon layer, except portions which are to provide an emitter electrode 26 and a gate electrode 28, is removed.

Thus, at the transistor forming region 100, an npn bipolar transistor 110 is formed.

Then at a MOS-element forming region 200, an n+type source and drain regions 32 are selectively formed by ion implantation. Thus, in the MOS-element forming region 200, an n-channel MOSFET 210 is formed.

In such a prior semiconductor device, the oxide film of the bipolar transistor 110 and that of the n-channel MOSFET 210 are formed as a common film 22, and also both the emitter electrode 26 and the gate electrode 28 are formed as a common film, thus simplifying the production process. Consequently, in the bipolar transistor 110, the oxide film 22 which serves as an insulator between the emitter electrode 26 and the p-type base region 24 must be formed so as to have a thickness equal to that of the gate oxide film 22 of the MOSFET 210. The resulting bipolar transistor 110 will, as a result, have a bad high frequency characteristic.

Between the emitter electrode 26 and the base region 24 in this bipolar transistor 110 there is a parasitic capacitance $C_{EB}$ corresponding to the thickness of the oxide film 22. In the meantime, as advances have been made in recent years in making MOSFETs smaller, there is a trend toward thinner gate oxide films. However, the thinner the gate oxide film of the MOSFETs, the more the parasitic capacitance $C_{EB}$ of the associated bipolar transistors will increase. Therefore, as the dimensions of the MOS elements are reduced, the high frequency characteristic of the bipolar transistors 110 will be lowered.

SUMMARY OF THE INVENTION

It is therefore an object of this invention to provide a semiconductor device which includes very small MOS elements and a high-speed bipolar element having a good high-frequency characteristic.

Another object of the invention is to provide a method of manufacturing the semiconductor device described above.

According to a first aspect of the invention, there is provided a semiconductor device comprising: a semiconductor substrate; a bipolar element located on the semiconductor substrate in such a manner that a base region and an emitter electrode are insulated from one another by a base/emitter electrode insulating film; and a MOS element located on the semiconductor substrate in such a manner that a gate electrode together with the emitter electrode of the bipolar element is formed in a common layer and that a gate oxide film is formed between the gate electrode and a layer adjacent to and under the first-named layer; the base/emitter electrode insulating film having a thickness greater than that of the gate oxide film.

According to a second aspect of the invention, there is provided a method of manufacturing a semiconductor device, comprising the steps of: forming first and second buried layers on a semiconductor substrate, forming an epitaxial grown layer on the first and second buried layers and forming a well at a MOS-element forming region in the epitaxial grown layer; forming a CVD film, as a base/emitter electrode insulating film, in a bipolar-element forming region of the epitaxial grown layer; forming a gate oxide film on a surface of the well and forming a base region in the bipolar-element forming region of the epitaxial grown layer by ion implantation; forming an emitter opening in an emitter forming region of the base/emitter electrode insulating film and forming a polycrystalline silicon film over both the bipolar-element forming region and the MOS-element forming region; and removing the polycrystalline silicon film except at electrode forming regions to form an emitter electrode and a gate electrode; whereby both the bipolar element having a thick base/emitter electrode insulating film and the MOS element having a thin gate oxide film are formed on a single semiconductor substrate.

According to a third aspect of the invention, there is provided a method of manufacturing a semiconductor device, comprising the steps of: forming first and second buried layers on a semiconductor substrate, forming an epitaxial grown layer on the first and second buried layers and forming a well at a MOS-element forming region in the epitaxial grown layer; forming a sacrificial gate oxide film on both the epitaxial grown layer and a surface of the well by thermal oxidation; selectively removing the sacrificial gate oxide film formed on the surface of the well; forming an oxide film on both the well and the remaining portions of the sacrificial gate oxide film by thermal oxidation in such a manner that the oxide film formed on the well constitutes a gate oxide film and that a stacked film of the gate oxide film and the sacrificial gate oxide film formed on the bipolar-element forming region constitutes a base/emitter electrode film; forming a base region in the bipolar element forming region of the epitaxial grown layer by ion implantation; forming an emitter opening in an emitter forming region of the base/emitter electrode insulating film and forming a polycrystalline silicon film over both the bipolar-element forming region and the MOS-element forming region; and removing the polycrystalline silicon film except at electrode forming regions to form an emitter electrode and a gate electrode; whereby both the bipolar element having a thick base/emitter electrode insulating film and the MOS element having a thin gate oxide film are formed on a single semiconductor substrate.

Since all or part of the base/emitter electrode insulating film between the emitter electrode and the base region of the bipolar element is formed in a step independent of the step in which the gate oxide film of the MOS element is formed, it is possible to form the base/emitter electrode insulating film of the bipolar element so as to have a thickness greater than that of the gate oxide film of the MOS element.

Therefore, it is possible to produce a semiconductor device in which a high-speed bipolar element having a good high-frequency characteristic and a very small MOS element coexist on the same semiconductor substrate.

DESCRIPTION OF THE PREFERRED EMBODIMENTS

Preferred embodiments of this invention will now be described with reference to the accompanying drawings.

Embodiment 1

Figure 1:
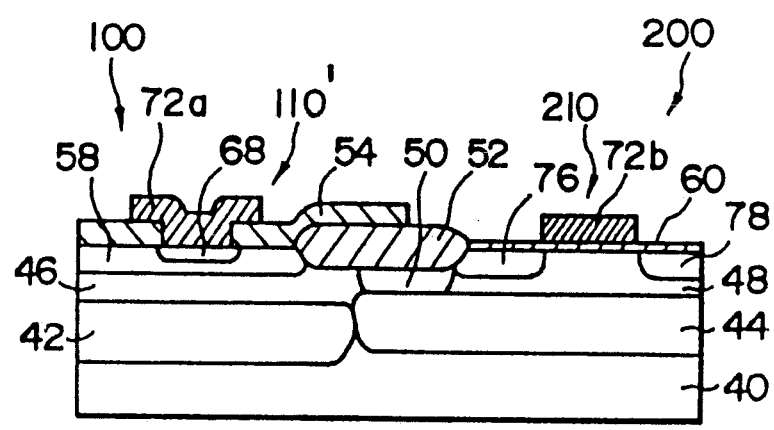
FIG. 1 is a schematic cross-sectional view of a semiconductor device according to a first embodiment of this invention.

FIG. 1 shows a semiconductor device according to a first embodiment of the invention.

The semiconductor device of this embodiment comprises a bipolar transistor forming region 100 in which an npn vertical bipolar transistor 110' of a bipolar washed polysilicon emitter structure, i.e. bipolar transistor with polysilicon emitter self-aligned structure as both a diffusion source and a contact for the shallow emitter, is formed in an n-type epitaxial grown silicon layer 46 on an n+-type buried layer 42 on the main surface of a p-type silicon substrate 40, and a MOS-element, or MOSFET, region 200 in which an n-channel MOSFET 210 formed in a p-type well 48 on a p+-type buried layer 44 on the main surface of the p-type silicon substrate 40.

In this embodiment, a base/emitter electrode insulating film 54 of the bipolar transistor 110' is formed in a step independent of the step in which a gate oxide film 60 is formed, thus guaranteeing an adequate film thickness. Even if the gate oxide film 60 is thinned more and more as the MOSFET 210 is reduced to a very small size, it is possible to avoid any increase of parasitic capacitance $C_{EB}$ between the base region 58 and the emitter electrode 72a of bipolar transistor 110'.

Thus it is possible to provide a large-scale-integration, high-speed semiconductor device in which both the very small MOSFET 210 and the bipolar transistor 110' having a good high frequency characteristic coexist on the same substrate.

FIGS. 2A–2D and 3A–3D show successive steps in the production process of the semiconductor device of FIG. 1.

Figure 2A:
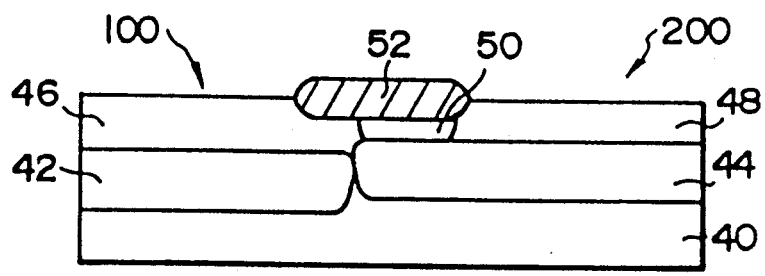
FIGS. 2A through 2D are cross-sectional views depicting successive stages in the process of fabricating the semiconductor device of FIG. 1.

Specifically, FIG. 2A shows a part of the semiconductor stacked substrate preliminarily processed ready for manufacturing the semiconductor device of this embodiment.

In this semiconductor stacked substrate, n+-type buried layer 42 and p+-type buried layer 44 are formed on the p-type silicon substrate 40, and an n-type epitaxial grown silicon layer 46 is formed thereover. The p-type well 48, a p-channel stop 50 and a field oxide film 52 are formed in the n-type epitaxial grown silicon layer 46.

Figure 2B:
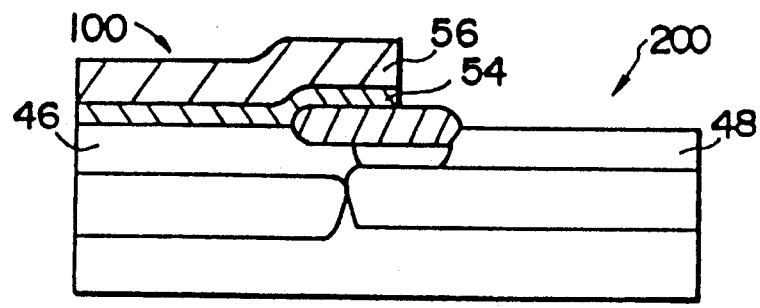

As shown in FIG. 2B, over the entire surface of the preliminarily processed semiconductor stacked substrate, a silicon oxide film 54 is formed by a CVD method so as to have a film thickness of 500 to 2000 Å. Then a photoresist film 56 is formed in bipolar transistor region 100 of the silicon oxide film 54, and the silicon oxide film 54 is selectively removed from the MOS-element region 200, after which the photoresist film 56 is removed.

According to this embodiment, it is possible to form, as the silicon oxide film 54, a relatively thick base/emitter electrode insulating film for bipolar transistor 110' in the bipolar transistor region 100 of the semiconductor stacked substrate.

In this embodiment, the silicon oxide film 54 is used as a base/emitter electrode insulating film. Alternatively, other kinds of insulating films such as a phosphorus-silicate glass (PSG) film, a boron-silicate glass (BSG) film, a boron-phosphorus-silicate glass (BPSG) film, or a plasma silicon nitride (P-SiN) film may selectively be used according to need.

Figure 2C:
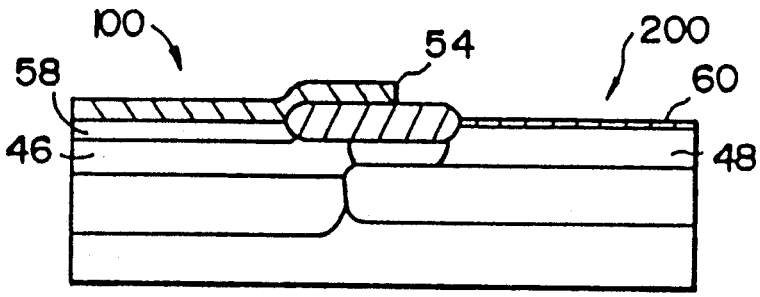

Subsequently, as shown in FIG. 2C, a gate oxide film 60 is formed on the surface of the p-type well 48 by thermal oxidation so as to have a film thickness of 100 to 300 Å. Further, in the n-type epitaxial grown silicon layer 46 of the bipolar transistor forming region 100, a p-type base region 58 is selectively formed by ion implantation.

Figure 2D:
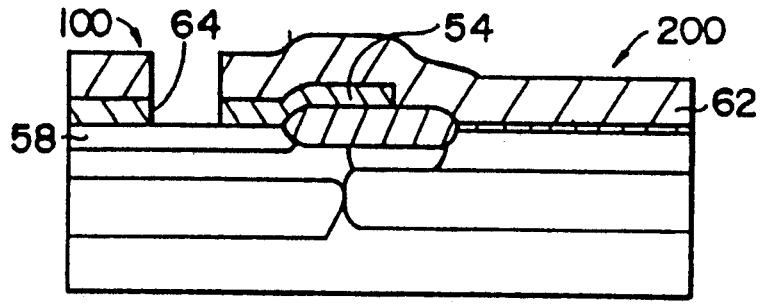

Then, as shown in FIG. 2D, a photoresist film 62 is coated over the entire surface of the substrate except emitter-opening region for bipolar transistor 110', and an emitter opening 64 is formed in bipolar transistor region 100 by photo etching, after which the photoresist film 62 is removed.

Figure 3A:
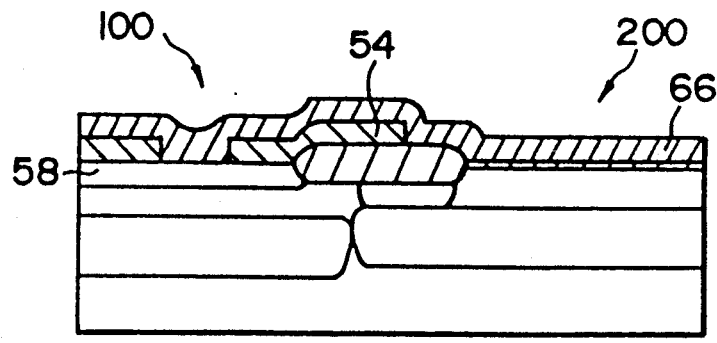
FIGS. 3A through 3D are cross-sectional views depicting successive stages in the process of fabricating the semiconductor device of FIG. 1 subsequent to the stages shown in FIGS. 2A through 2D.

Subsequently, as shown in FIG. 3A, over the entire surface of the stacked substrate, a polycrystalline silicon layer 66 is deposited by CVD method so as to have a film thickness of 2000 to 5000 Å.

Figure 3B:
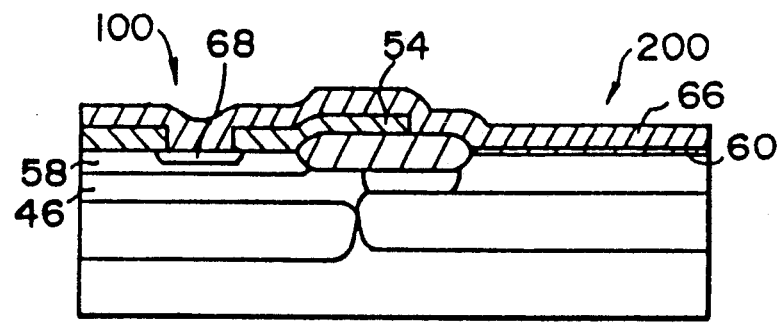

Then, as shown in FIG. 3B, after doping an n-type impurity such as phosphorus or arsenic into the entire substrate, specifically into polycrystalline silicon layer 66 by ion implantation or a pre-deposition method, the stacked substrate is annealed at a temperature of 900° to 1000° C. in a nitrogen gas atmosphere for 20 to 30 minutes to provide an n+-type emitter region 68 in the base region 58 of bipolar transistor 110'.

Figure 3C:
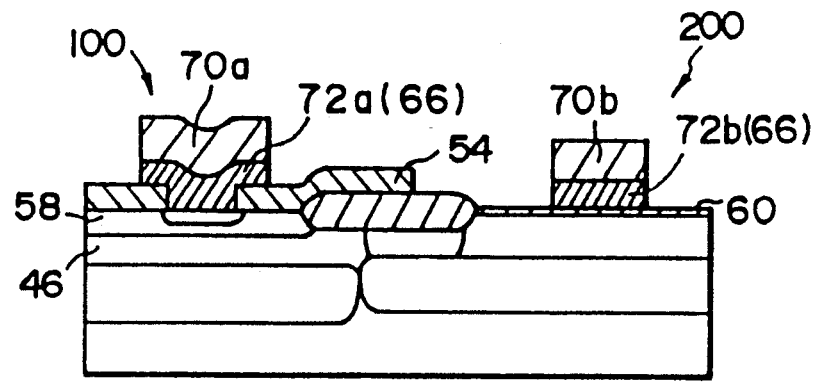

Further, as shown in FIG. 3C, a patterned photoresist film is formed to provide photoresist film portions 70a and 70b over emitter region 68 and a MOS element gate electrode forming region of the polycrystalline silicon layer 66, after which all of the polycrystalline silicon layer 66 except for emitter and gate electrodes 72a and 72b is selectively removed by photo etching. Then the photoresist film portions 70a, 70b are removed.

In this embodiment, both the emitter electrode 72a of the bipolar transistor 110' and gate electrode 72b of the MOSFET 210 are formed in the same layer.

Figure 3D:
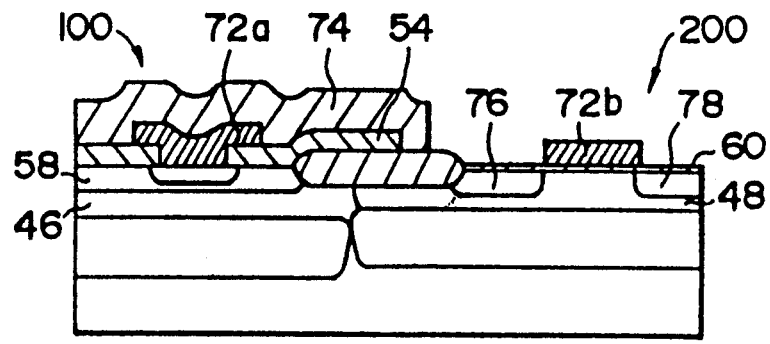

Then, as shown in FIG. 3D, a photoresist film 74 is coated over the bipolar transistor region 100, and then n+-type source and drain regions 76 and 78 are selectively formed in the MOS-element region 200 of the stacked substrate by ion implantation.

Subsequently, the photoresist film 72 is selectively removed to provide the semiconductor device of FIG. 1.

According to this embodiment, it is possible to produce a semiconductor device in which both an npn bipolar transistor 110' and an n-channel MOSFET 210 are formed on the same stacked substrate.

Specifically, the base/emitter electrode insulating film, i.e. silicon oxide film 54, which serves as an insulator between the base region 58 and the emitter electrode 72a of npn bipolar transistor 110' is a CVD film formed in a step independent of the step in which the gate oxide film 60 is formed. Therefore, it is possible to establish the thickness of the base/emitter electrode insulating film 54 independently of the thickness of the gate oxide film 60.

Even when reducing the thickness of the gate oxide film 60 of the n-channel MOSFET 210 to 100 to 300 Å, it is possible to form the base/emitter electrode insulating film 54, which is to be formed on the base region 58 of the npn bipolar transistor 110', so as to have an adequate thickness of 500 to 2000 Å, thus maintaining the parasitic capacitance $C_{EB}$ of the bipolar transistor 110' at a satisfactorily low value.

Therefore it is possible to produce a large-scale integration and high-speed semiconductor device in which a very small MOSFET 210 and a bipolar transistor 110' having a good high-frequency characteristic coexist on the same substrate.

Embodiment 2

A modified semiconductor device according to a second embodiment will now be described. Like reference numerals designate parts or elements similar to those of the first embodiment, and a repetition of the description thereof is omitted here for clarity.

Figure 4:
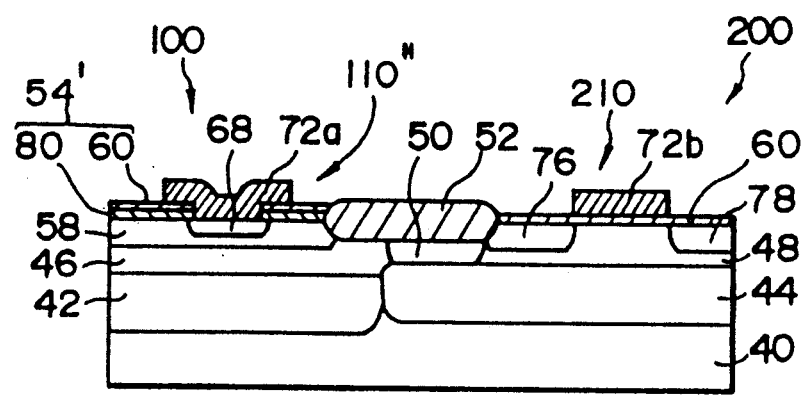
FIG. 4 is a schematic cross-sectional view of a modified semiconductor device according to a second embodiment of the invention.

FIG. 5 shows the production process of the modified semiconductor device and the completed device is shown in FIG. 4.

In this embodiment, like the first embodiment, firstly the preliminarily process semiconductor stacked substrate of FIG. 2A is produced.

Figure 5A:
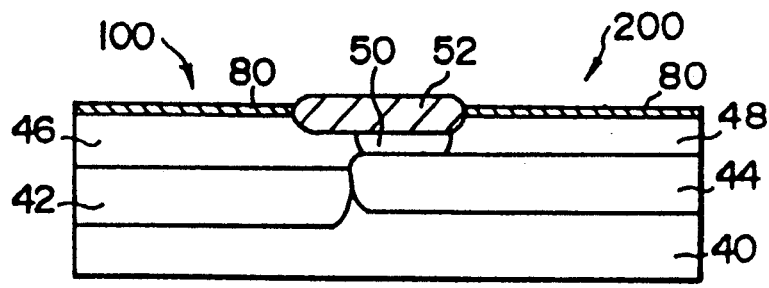
FIGS. 5A through 5D are cross-sectional views depicting successive stages in the process of fabricating the semiconductor device of FIG. 4.

Then, as shown in FIG. 5A, a sacrificial gate oxide film 80 having a thickness of 400 to 1000 Å is formed over both an n-type epitaxial grown silicon layer 46 and a p-type well 48 of the semi-conductor stacked substrate by thermal oxidation.

With the sacrificial gate oxide film 80, it is possible to remove surface defects of the p-type well 48 in the MOSFET region 200.

Figure 5B:
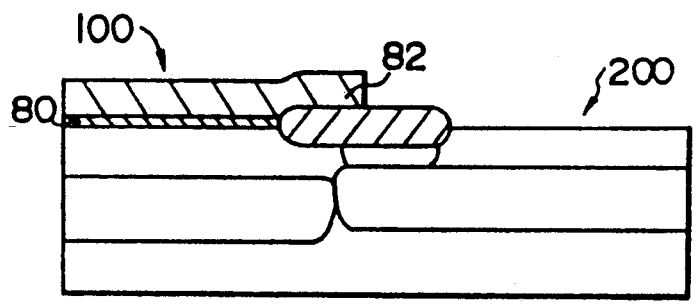

Subsequently, as shown in FIG. 5B, a photoresist film 82 is coated over the sacrificial gate oxide film 80 of bipolar transistor region 100, and the sacrificial gate oxide film 80 is selectively removed from the MOS-element region 200 by photo etching, after which photoresist film 82 is removed.

Figure 5C:
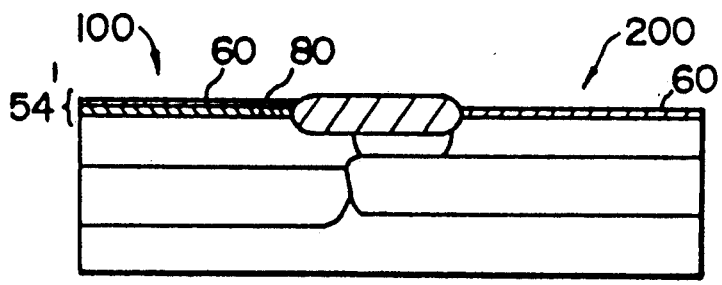

Then, as shown in FIG. 5C, a gate oxide film 60 having a thickness of 100 to 300 Å is formed over the sacrificial gate oxide film 80 in region 100 and the p-type well 48 in region 200 by thermal oxidation. At that time, since the surface defects of the p-type well 48 has already been removed by the sacrificial gate oxide film 80, the base oxide film 60 constituting part of the MOSFET 210 serves as a defect-free insulating film.

In the bipolar transistor region 100, the stacked film of the sacrificial gate oxide film 80 and the gate oxide film 60 will serve as a base/emitter electrode insulating film 54'. Specifically, it is possible to increase the thickness of the base/emitter electrode insulating film 54' by using the sacrificial gate oxide film 60, which would otherwise be removed, as part of the base/emitter electrode insulating film 54'.

Figure 5D:
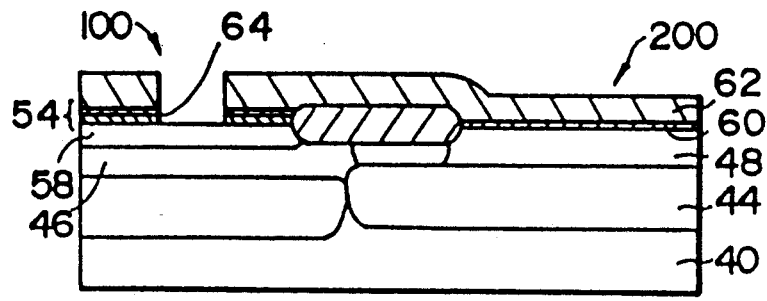
Figure 6:
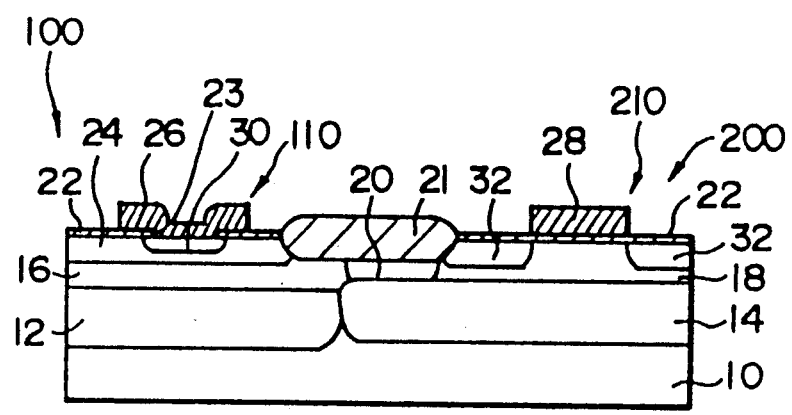
FIG. 6 is a schematic cross-sectional view of a prior art semiconductor device.

Then, as shown in FIG. 5D, a p-type base region 58 is selectively formed in the n-type epitaxial grown silicon layer 46 of the bipolar transistor region 100 by ion implantation, and then a photoresist film 62 is coated over the substrate at the entire substrate region except for the site of an emitter-opening region for the bipolar transistor, and then an emitter opening 64 is formed by photo etching.

Subsequently, electrodes are formed in the same manner as in the production process of the first embodiment of FIGS. 3A through 3D, thereby producing the semiconductor device of the second embodiment of FIG. 4.

In the second embodiment, the base/emitter electrode insulating film 54' formed on the p-type base region 58 of the npn bipolar transistor 110" is a stacked film of the sacrificial gate oxide film 80 and the gate oxide film 80. Partly since the sacrificial gate oxide film 80 has a thickness of 400 to 1000 Å, and partly since the gate oxide film 60 has a thickness of 100 to 300 Å, the thickness of the base/emitter electrode insulating film 54' of the npn bipolar transistor 110" can be made to be adequately thick, compared with the 100–300 Å thickness of the gate oxide film 60 of the MOSFET 210.

According to this embodiment, like the first embodiment, it is possible to produce a large-scale integration and high-speed semiconductor device in which both a very small MOSFET 210 and a high-speed bipolar transistor 110" having a good high-frequency characteristic are disposed on the same substrate.

In each of the illustrated embodiments, the npn bipolar transistor and the n-channel MOSFET are used as a bipolar element and a MOS element, respectively. Alternatively, other bipolar elements and MOS elements may be used in combination.

According to the first and second embodiments, the base/emitter electrode insulating film interposed between the base diffusion region and the emitter electrode of the bipolar element is a thick insulating film which is formed independently of the gate oxide film of the MOS element. Even when thinning the gate oxide film in conjunction with reducing the MOS element to a very small size, it is possible to prevent any increase of the parasitic capacitance $C_{EB}$ of the bipolar element. Therefore it is possible to realize a semiconductor device suitable for large scale integration and high speed, since both a very small MOSFET and a high-speed bipolar element having a good high-frequency characteristic coexist on the same substrate.

This application relates to subject matter disclosed in Japanese Application numbers 221932/90 and 221933/90, filed on Aug. 23, 1990, and Japanese Application number 175391/91 filed Jul. 16, 1991, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

I claim:

1. A method of manufacturing a semiconductor device, comprising the steps of:
   (a) forming first and second buried layers on a single semiconductor substrate, forming an epitaxial grown layer on said first and second buried layers, said epitaxial grown layer having a MOS-element region and a bipolar-element region, and forming a well having a surface at the MOS-element region in said epitaxial grown layer;
   (b) forming a single CVD film, as a base/emitter electrode insulating film having an emitter region, in the bipolar-element region of said epitaxial grown layer;
   (c) forming a gate oxide film having a gate electrode region on the surface of said well, said gate oxide film being thinner than said single CVD film and performing ion implantation through said single CVD film to form a base region in said bipolar-element region of said epitaxial grown layer;
   (d) forming an emitter opening in the emitter region of said base/emitter electrode insulating film and forming a polycrystalline silicon film simultaneously over both said bipolar-element region and said MOS-element region; and
   (e) removing a portion of said polycrystalline silicon film while leaving parts of said polycrystalline silicon film at the emitter region to form an emitter electrode and at the gate electrode region to form a gate electrode;
   (f) whereby both a bipolar element having said base/emitter electrode insulating film and a MOS element having said gate oxide film are formed on the single semiconductor substrate.

2. A method according to claim 1 wherein said gate oxide film has a thickness of 100 to 300 Å.

3. A method according to claim 2 wherein said base/emitter electrode insulating film has a thickness of 500 to 200 Å.

4. A method according to claim 1 wherein said base/emitter electrode insulating film has a thickness of 500 to 2000 Å.

5. A method according to claim 2 wherein said base/emitter electrode insulating film is a silicon oxide film having a thickness of 500 to 2000 Å.

6. A method according to claim 1 wherein said semiconductor substrate is a silicon substrate having a main surface, said epitaxial grown silicon layer is grown on said main surface of said silicon substrate, said bipolar element is a vertical bipolar transistor of washed polysilicon emitter structure in said epitaxial grown silicon layer, and said MOS element is a MOSFET in said well on the main surface of said silicon substrate.

7. A method of manufacturing a semiconductor device, comprising the steps of:
   (a) forming first and second buried layers on a single semiconductor substrate, forming an epitaxial grown layer on said first and second buried layers, said epitaxial grown layer having a MOS-element region and a bipolar-element region, and forming a well having a surface at the MOS-element region in said epitaxial grown layer;
   (b) forming a sacrificial gate oxide film on both said epitaxial grown layer at said bipolar-element region and a surface of said well at said MOS-element region by thermal oxidation;
   (c) selectively removing said sacrificial gate oxide film formed on the surface of said well at said MOS-element region;
   (d) forming an oxide film on both said well at said MOS-element region and said sacrificial gate oxide film at said bipolar-element region by thermal oxidation in such a manner that said oxide film formed on said well constitutes a gate oxide film and that a stacked film of said oxide film and said sacrificial gate oxide film formed on said bipolar-element region constitutes a base/emitter electrode insulating film having an emitter region, said gate oxide film being thinner than said base/emitter electrode insulating film;
   (e) performing ion implantation through said base/emitter electrode insulating film to form a base region in said bipolar-element region of said epitaxial grown layer;
   (f) forming an emitter opening in said emitter region of said base/emitter electrode insulating film and forming a polycrystalline silicon film simultaneously over both said bipolar-element region and said MOS-element region; and
   (g) removing a portion of said polycrystalline silicon film while leaving parts of said polycrystalline silicon film at the emitter region to form an emitter electrode and at the gate electrode region to form a gate electrode;
   (h) whereby both a bipolar element having said base/emitter electrode insulating film and a MOS element having said gate oxide film are formed on the single semiconductor substrate.

8. A method according to claim 7 wherein said sacrificial gate oxide film has a thickness of 400 to 1000 Å.

9. A method according to claim 8 wherein said gate oxide film has a thickness of 100 to 300 Å.

10. A method according to claim 7 wherein said gate oxide film has a thickness of 100 to 300 Å.

11. A method according to claim 7 wherein said semiconductor substrate is a silicon substrate having a main surface, said epitaxial grown silicon layer is grown on said main surface of said silicon substrate, said bipolar element is a vertical bipolar transistor of washed polysilicon emitter structure in said epitaxial grown silicon layer, and said MOS element is a MOSFET in said well on the main surface of said silicon substrate.

* * * * *